United States Patent
Huang et al.

(10) Patent No.: US 11,964,915 B2
(45) Date of Patent: Apr. 23, 2024

(54) CERAMIC MATERIAL AND WIRE BONDING CAPILLARY

(71) Applicant: Industrial Technology Research Institute, Hsinchu (TW)

(72) Inventors: Tien-Heng Huang, Tainan (TW); Yu-Han Wu, Taipei (TW); Kuo-Chuang Chiu, Hsinchu (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 242 days.

(21) Appl. No.: 17/554,835

(22) Filed: Dec. 17, 2021

(65) Prior Publication Data
US 2022/0204409 A1    Jun. 30, 2022

Related U.S. Application Data

(60) Provisional application No. 63/130,972, filed on Dec. 28, 2020.

(51) Int. Cl.
| | | |
|---|---|---|
| *B23K 20/00* | (2006.01) | |
| *C04B 35/00* | (2006.01) | |
| *C04B 35/488* | (2006.01) | |
| *C04B 35/622* | (2006.01) | |
| *H01L 23/00* | (2006.01) | |

(52) U.S. Cl.
CPC ........ *C04B 35/4885* (2013.01); *B23K 20/005* (2013.01); *C04B 35/6225* (2013.01); *H01L 24/78* (2013.01); *C04B 2201/50* (2013.01); *C04B 2235/3217* (2013.01); *C04B 2235/3248* (2013.01); *C04B 2235/404* (2013.01); *C04B 2235/405* (2013.01); *H01L 2224/78309* (2013.01); *H01L 2224/786* (2013.01)

(58) Field of Classification Search
CPC ............ C04B 35/4885; C04B 35/6225; C04B 2201/50; C04B 2235/3217; C04B 2235/3248; C04B 2235/404; C04B 2235/405; C04B 2235/3208; C04B 2235/3224; C04B 2235/3227; C04B 2235/3232; C04B 2235/3239; C04B 2235/3241; C04B 2235/3256; C04B 2235/3262; C04B 2235/3272; C04B 2235/3275; C04B 2235/3281; C04B 2235/3284; C04B 2235/6567; C04B 35/119; C04B 2235/96; C04B 35/10; C04B 35/622; C04B 2235/3244; H01L 24/78; H01L 2224/78309; H01L 2224/786; H01L 2924/00014; B23K 37/02; B23K 20/004; B23K 20/005; B23K 20/007
USPC ...................................... 228/4.5, 180.5, 904
See application file for complete search history.

(56) References Cited

U.S. PATENT DOCUMENTS

| | | | |
|---|---|---|---|
| 5,312,789 | A | 5/1994 | Wood |
| 6,074,109 | A | 6/2000 | Ghosh et al. |
| 6,164,846 | A | 12/2000 | Chatterjee et al. |
| 9,586,860 | B2 | 3/2017 | Ukraomczyk |
| 2010/0130346 | A1 | 5/2010 | Laine et al. |
| 2016/0052162 | A1 | 2/2016 | Colin et al. |

FOREIGN PATENT DOCUMENTS

| | | | |
|---|---|---|---|
| CN | 1094079 | A | 10/1994 |
| CN | 1134692 | A | 10/1996 |
| CN | 1140155 | A | 1/1997 |
| CN | 1152844 | C | 6/2004 |
| CN | 101162784 | A * | 4/2008 |
| CN | 102795842 | A | 11/2012 |
| CN | 104193310 | A | 12/2014 |
| CN | 105236941 | A | 1/2016 |
| CN | 106191496 | A | 12/2016 |
| CN | 106995308 | A | 8/2017 |
| CN | 107473740 | A | 12/2017 |
| CN | 107546136 | A | 1/2018 |
| CN | 108395220 | A | 8/2018 |
| CN | 108610028 | A | 10/2018 |
| CN | 110078480 | A | 8/2019 |
| CN | 111233444 | A | 6/2020 |
| CN | 111646782 | A | 9/2020 |
| JP | S63162570 | A | 7/1988 |
| JP | 2006062921 | A | 3/2006 |

OTHER PUBLICATIONS

Machine translation of CN-1378993A (no date available).*
Machine translation of CN-108610028A (no date available).*
Machine translation of CN-106995308A (no date available).*
China Patent Office, Office Action, Patent Application Serial No. 202111550636.X, dated Oct. 31, 2022, China.
Taiwan Patent Office, Office Action, Patent Application Serial No. 110147358, dated Aug. 16, 2022, Taiwan.

* cited by examiner

*Primary Examiner* — Kiley S Stoner

(57) ABSTRACT

A ceramic material includes zirconia toughened alumina (ZTA), which is doped with zinc ions and other metal ions, in which the other metal ions are chromium (Cr) ions, titanium (Ti) ions, gadolinium (Gd) ions, manganese (Mn) ions, cobalt (Co) ions, iron (Fe) ions, or a combination thereof. The ceramic material may have a hardness of 1600 Hv10 to 2200 Hv10 and a bending strength of 600 MPa to 645 MPa. The ceramic material can be used as wire bonding capillary.

12 Claims, No Drawings

CERAMIC MATERIAL AND WIRE BONDING CAPILLARY

CROSS REFERENCE TO RELATED APPLICATIONS

This application claims the benefit of U.S. Provisional Application No. 63/130,972 filed on Dec. 28, 2020, the entirety of which is/are incorporated by reference herein.

TECHNICAL FIELD

The technical field relates to a wire bonding capillary, and in particular it relates to a ceramic material thereof.

BACKGROUND

The top 10 global IC packaging and testing manufacturers use more than 100,000 wire bonding machines, and the output value of the capillary used in the wire bonding machines is more than 500 million US dollars per year. The imported value of Taiwan's IC and LED packaging industry is approximately 250 million US dollars per year. Since the capillary needs to contact the electrodes (solder points) of the chip and the lead frame at a high speed, it will become worn down or deformed after being utilized a certain number of times (about 600,000 points), thereby resulting in problems such as disconnections or poor contacts. As such, it is necessary to develop domestic capillary products with ultra-precision, high strength and long lifespans.

SUMMARY

One embodiment of the disclosure provides a ceramic material, including zirconia toughened alumina (ZTA), which is doped with zinc ions and other metal ions, wherein the other metal ions are chromium (Cr) ions, titanium (Ti) ions, gadolinium (Gd) ions, manganese (Mn) ions, cobalt (Co) ions, iron (Fe) ions, or a combination thereof.

In some embodiments, the alumina and zirconia have a weight ratio of 100:15 to 100:30.

In some embodiments, the zirconia toughened alumina and the zinc ions have a weight ratio of 100:1 to 100:2.

In some embodiments, the zirconia toughened alumina and the other metal ions have a weight ratio of 100:0.5 to 100:2.

In some embodiments, the zinc ions and the other metal ions have a weight ratio of 1:0.05 to 1:1.25.

In some embodiments, the ceramic material has a hardness of 1600 Hv10 to 2200 Hv10.

In some embodiments, the ceramic material has a bending strength of 600 MPa to 645 MPa.

One embodiment of the disclosure provides a wire bonding capillary, including a ceramic material. The ceramic material includes zirconia toughened alumina (ZTA), which is doped with zinc ions and other metal ions, wherein the other metal ions are chromium (Cr) ions, titanium (Ti) ions, gadolinium (Gd) ions, manganese (Mn) ions, cobalt (Co) ions, iron (Fe) ions, or a combination thereof.

In some embodiments, the alumina and zirconia have a weight ratio of 100:15 to 100:30.

In some embodiments, the zirconia toughened alumina and the zinc ions have a weight ratio of 100:1 to 100:2.

In some embodiments, the zirconia toughened alumina and the other metal ions have a weight ratio of 100:0.5 to 100:2.

In some embodiments, the zinc ions and the other metal ions have a weight ratio of 1:0.06 to 1:0.9.

In some embodiments, the wire bonding capillary has a hardness of 1600 Hv10 to 2200 Hv10.

In some embodiments, the wire bonding capillary has a bending strength of 600 MPa to 645 MPa.

A detailed description is given in the following embodiments.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details.

One embodiment of the disclosure provides a ceramic material, including zirconia toughened alumina (ZTA), which is doped with zinc ions and other metal ions. The other metal ions are chromium (Cr) ions, titanium (Ti) ions, gadolinium (Gd) ions, manganese (Mn) ions, cobalt (Co) ions, iron (Fe) ions, or a combination thereof If the other metal ions utilize any other metal ions (besides the described other metal ions), it will be difficult to achieve the required properties of the ceramic material.

In some embodiments, the alumina and the zirconia have a weight ratio of about 100:15 to 100:30, such as about 100:18, about 100:20, about 100:22, or the like, but the disclosure is not limited thereto. If the amount of the zirconia is too low or too high, it cannot achieve the effect of toughening the alumina. In some embodiments, zirconia toughened alumina (ZTA) and the zinc ions have a weight ratio of about 100:1 to 100:2, such as about 100:1.2, about 100:1.5, about 100:1.8, or the like, but the disclosure is not limited thereto. If the amount of zinc is too low or too high, both the hardness and the bending strength of the ceramic material will be insufficient.

In some embodiments, zirconia toughened alumina (ZTA) and the other metal ions may have a weight ratio of about 100:0.5 to 100:2, such as about 100:0.75, about 100:1, about 100:1.25, about 100:1.5, about 100:1.75, or the like, but the disclosure is not limited thereto. If the amount of the other metal ions is too low or too high, the hardness and the bending strength of the ceramic material will be insufficient. In some embodiments, the zinc ions and the other metal ions may have a weight ratio of about 1:0.05 to 1:1.25, such as about 1:0.06 to 1:0.9, about 1:0.08 to 1:1.2, about 1:0.1 to 1:1.15, about 1:0.2 to 1:1.12, about 1:0.5 to 1:1.1, about 1:1, about 1:0.9, or the like, but the disclosure is not limited thereto. If the amount of the zinc ions is too high, the hardness of the ceramic material will be poor. If the amount of the other metal ions is too high, the hardness of the ceramic material will be also poor.

In some embodiments, the ceramic material may have a hardness of about 1600 Hv10 to 2200 Hv10, such as about 1700 Hv10 to 2100 Hv10, about 1800 Hv10 to 2000 Hv10, about 1650 Hv10 to 1950 Hv10, about 1750 Hv10 to 2150 Hv10, about 1850 Hv10, about 2180 Hv10, or the like, but the disclosure is not limited thereto. If the hardness of the ceramic material is too low, it cannot meet the specification of the wire bonding capillary. In some embodiments, the ceramic material may have a bending strength of about 600 MPa to 645 MPa, such as 615 MPa to 640 Mpa, about 620 MPa to 635 MPa, about 625 MPa, about 630 MPa, and the likes, but the disclosure is not limited thereto. If the bending strength of the ceramic material is too low, it cannot meet the specification of the wire bonding capillary.

One embodiment of the disclosure provides a wire bonding capillary including the described ceramic material. It should be understood that the ceramic can be used in another application other than the wire bonding capillary, such as the orthopedic implants, direct bonded copper (DBC), low temperature co-fired ceramic (LTCC), or the like, but the disclosure is not limited thereto.

The ceramic material can be formed by mixing an appropriate ratio of alumina and zirconia to form zirconia toughened alumina (ZTA). Subsequently, an appropriate ratio of ZTA, a zinc source, and another metal source are mixed. The zinc source and the other metal source can be oxide, acetate salt, nitric salt, or another suitable salt. The mixture is ground to form powder, which are molded and sintered to form a ceramic material. It's worth noting that the described method is one of the methods (not only) to form the ceramic material, and the disclosure is not limited thereto. One skilled in the art may adopt any other applicable method to dope appropriate amounts of the zinc ions and the other metal ions into ZTA to form the described ceramic material.

Below, exemplary embodiments will be described in detail so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

EXAMPLES

In following Examples, the hardness of the ceramic material was measured according to the standard CNS 13983. In following Examples, the bending strength of the ceramic material was measured according to the standard CNS 12701.

Example 1

$Al_2O_3$ (56.8 g, 100 wt %) and $ZrO_2$ (20.23 g, 25 wt %) were firstly mixed to form zirconia toughened alumina (ZTA). 100 parts by weight of ZTA, zinc oxide (containing 1.633 to 1.729 parts by weight of Zn ions), and chromium oxide (containing 1.41 to 5.891 parts by weight of Cr ions) were mixed, and the mixture powder and 80 g of ethanol were added into a ball-milling pot to be put into a ball-milling machine, and then ball-milling mixed for 24 hours. The ball-milling product was dried and ground to form powder. An appropriate amount of the powder was pressed under a pressure of 40 kg/m² to manufacture a round body with a diameter of 11 mm, which was heated to 1500° C. to 1650° C. and kept for 1 hour to obtain a ceramic material. The composition ratio and hardness of the ceramic materials are tabulated in Table 1. As shown in Table 1, the hardness of the ceramic materials doped with Zn ions and Cr ions (in which the Zn ions and the Cr ions had a weight ratio of about 1:0.05 to 1:1.25, such as 1:0.85) could be increased from 1414.1 Hv10 to 1884 Hv10, and the bending strength thereof could be 632.29 MPa. However, the hardness of the ceramic material was decreased by further increasing the doping amounts of the Cr ions.

TABLE 1

| ZTA | Zn | Cr | Hv10 |
| --- | --- | --- | --- |
| 100 | 0 | 0 | 1414.1 |
| 100 | 1.633 | 0 | 1625.4 |
| 100 | 1.656 | 1.410 | 1884 |
| 100 | 1.680 | 2.861 | 853.1 |
| 100 | 1.729 | 5.891 | 652.0 |

Example 2

$Al_2O_3$ (56.8 g, 100 wt %) and $ZrO_2$ (20.23 g, 25 wt %) were firstly mixed to form zirconia toughened alumina (ZTA). 100 parts by weight of ZTA, zinc oxide (containing 1.633 to 7.145 parts by weight of Zn ions), and chromium oxide (containing 1.42 to 1.506 parts by weight of Cr ions) were mixed, and the mixture powder and 80 g of ethanol were added into a ball-milling pot to be put into a ball-milling machine, and then ball-milling mixed for 24 hours. The ball-milling product was dried and ground to form powder. An appropriate amount of the powder was pressed under a pressure of 40 kg/m² to manufacture a round body with a diameter of 11 mm, which was heated to 1500° C. to 1650° C. and kept for 1 hour to obtain a ceramic material. The compositions and hardness of the ceramic materials are tabulated in Table 2. As shown in Table 2, the hardness of the ceramic materials was enhanced by increasing the doping amount of the Zn ions. When the Zn ions and the Cr ions had a weight ratio of about 1:0.05 to 1:1.25 (e.g. about 1:0.85), the hardness of the ceramic material could be increased from 1414.1 Hv10 to 1884 Hv10, and the bending strength thereof could be 632.29 MPa. However, the hardness of the ceramic material was decreased by further increasing the doping amounts of the Zn ions.

TABLE 2

| ZTA | Zn | Cr | Hv10 |
| --- | --- | --- | --- |
| 100 | 0 | 0 | 1414.1 |
| 100 | 1.633 | 0 | 1625.4 |
| 100 | 1.656 | 1.410 | 1884 |
| 100 | 3.301 | 1.445 | 1399.8 |
| 100 | 7.145 | 1.506 | 1290.4 |

Example 3

$Al_2O_3$ (64 g, 100 wt %) and $ZrO_2$ (13.48 g, 21.1 wt %) were firstly mixed to form zirconia toughened alumina (ZTA). 100 parts by weight of ZTA, zinc oxide (containing 1.64 parts by weight of Zn ions), and cobalt oxide (containing 0.73 parts by weight of Co ions) were mixed, and the mixture powder and 80 g of ethanol were added into a ball-milling pot to be put into a ball-milling machine, and then ball-milling mixed for 24 hours. The ball-milling product was dried and ground to form powder. An appropriate amount of the powder was pressed under a pressure of 40 kg/m² to manufacture a round body with a diameter of 11 mm, which was heated to 1500° C. to 1650° C. and kept for 1 hour to obtain a ceramic material. The ceramic material had a hardness of 2065.1 Hv10 and a bending strength of 608.63 MPa.

Example 4

$Al_2O_3$ (64 g, 100 wt %) and $ZrO_2$ (13.48 g, 21.1 wt %) were firstly mixed to form zirconia toughened alumina (ZTA). 100 parts by weight of ZTA, zinc oxide (containing 1.65 parts by weight of Zn ions), and titanium oxide (containing 1.24 parts by weight of Ti ions) were mixed, and the mixture powder and 80 g of ethanol were added into a ball-milling pot to be put into a ball-milling machine, and then ball-milling mixed for 24 hours. The ball-milling product was dried and ground to form powder. An appropriate amount of the powder was pressed under a pressure of 40 kg/m$^2$ to manufacture a round body with a diameter of 11 mm, which was heated to 1500° C. to 1650° C. and kept for 1 hour to obtain a ceramic material. The ceramic material had a hardness of 1716.3 Hv10.

Example 5

$Al_2O_3$ (64 g, 100 wt %) and $ZrO_2$ (13.48 g, 21.1 wt %) were firstly mixed to form zirconia toughened alumina (ZTA). 100 parts by weight of ZTA, zinc oxide (containing 1.65 parts by weight of Zn ions), and gadolinium oxide (containing 1.76 parts by weight of Gd ions) were mixed, and the mixture powder and 80 g of ethanol were added into a ball-milling pot to be put into a ball-milling machine, and then ball-milling mixed for 24 hours. The ball-milling product was dried and ground to form powder. An appropriate amount of the powder was pressed under a pressure of 40 kg/m$^2$ to manufacture a round body with a diameter of 11 mm, which was heated to 1500° C. to 1650° C. and kept for 1 hour to obtain a ceramic material. The ceramic material had a hardness of 1769.9 Hv10.

Example 6

$Al_2O_3$ (64 g, 100 wt %) and $ZrO_2$ (13.48 g, 21.1 wt %) were firstly mixed to form zirconia toughened alumina (ZTA). 100 parts by weight of ZTA, zinc oxide (containing 1.65 parts by weight of Zn ions), and manganese oxide (containing 1.6 parts by weight of Mn ions) were mixed, and the mixture powder and 80 g of ethanol were added into a ball-milling pot to be put into a ball-milling machine, and then ball-milling mixed for 24 hours. The ball-milling product was dried and ground to form powder. An appropriate amount of the powder was pressed under a pressure of 40 kg/m$^2$ to manufacture a round body with a diameter of 11 mm, which was heated to 1500° C. to 1650° C. and kept for 1 hour to obtain a ceramic material. The ceramic material had a hardness of 2080 Hv10.

Example 7

$Al_2O_3$ (64 g, 100 wt %) and $ZrO_2$ (13.48 g, 21.1 wt %) were firstly mixed to form zirconia toughened alumina (ZTA). 100 parts by weight of ZTA, zinc oxide (containing 1.64 parts by weight of Zn ions), and iron oxide (containing 0.71 parts by weight of Fe ions) were mixed, and the mixture powder and 80 g of ethanol were added into a ball-milling pot to be put into a ball-milling machine, and then ball-milling mixed for 24 hours. The ball-milling product was dried and ground to form powder. An appropriate amount of the powder was pressed under a pressure of 40 kg/m$^2$ to manufacture a round body with a diameter of 11 mm, which was heated to 1500° C. to 1650° C. and kept for 1 hour to obtain a ceramic material. The ceramic material had a hardness of 2042.1 Hv10.

Comparative Example 1

$Al_2O_3$ (64 g, 100 wt %) and $ZrO_2$ (13.48 g, 21.1 wt %) were firstly mixed to form zirconia toughened alumina (ZTA). 100 parts by weight of ZTA, zinc oxide (containing 1.66 parts by weight of Zn ions), and lanthanum oxide (containing 1.76 parts by weight of La ions) were mixed, and the mixture powder and 80 g of ethanol were added into a ball-milling pot to be put into a ball-milling machine, and then ball-milling mixed for 24 hours. The ball-milling product was dried and ground to form powder. An appropriate amount of the powder was pressed under a pressure of 40 kg/m$^2$ to manufacture a round body with a diameter of 11 mm, which was heated to 1500° C. to 1650° C. and kept for 1 hour to obtain a ceramic material. The ceramic material had a hardness of 1488 Hv10.

Comparative Example 2

$Al_2O_3$ (64 g, 100 wt %) and $ZrO_2$ (13.48 g, 21.1 wt %) were firstly mixed to form zirconia toughened alumina (ZTA). 100 parts by weight of ZTA, zinc oxide (containing 1.65 parts by weight of Zn ions), and calcium oxide (containing 0.82 parts by weight of Ca ions) were mixed, and the mixture powder and 80 g of ethanol were added into a ball-milling pot to be put into a ball-milling machine, and then ball-milling mixed for 24 hours. The ball-milling product was dried and ground to form powder. An appropriate amount of the powder was pressed under a pressure of 40 kg/m$^2$ to manufacture a round body with a diameter of 11 mm, which was heated to 1500° C. to 1650° C. and kept for 1 hour to obtain a ceramic material. The ceramic material had a hardness of 1496.7 Hv10.

Comparative Example 3

$Al_2O_3$ (64 g, 100 wt %) and $ZrO_2$ (13.48 g, 21.1 wt %) were firstly mixed to form zirconia toughened alumina (ZTA). 100 parts by weight of ZTA, zinc oxide (containing 1.66 parts by weight of Zn ions), and copper oxide (containing 1.65 parts by weight of Cu ions) were mixed, and the mixture powder and 80 g of ethanol were added into a ball-milling pot to be put into a ball-milling machine, and then ball-milling mixed for 24 hours. The ball-milling product was dried and ground to form powder. An appropriate amount of the powder was pressed under a pressure of 40 kg/m$^2$ to manufacture a round body with a diameter of 11 mm, which was heated to 1500° C. to 1650° C. and kept for 1 hour to obtain a ceramic material. The ceramic material had a hardness of 1226.7 Hv10.

Comparative Example 4

$Al_2O_3$ (64 g, 100 wt %) and $ZrO_2$ (13.48 g, 21.1 wt %) were firstly mixed to form zirconia toughened alumina (ZTA). 100 parts by weight of ZTA and vanadium oxide (containing 1.38 parts by weight of V ions) were mixed, and the mixture powder and 80 g of ethanol were added into a ball-milling pot to be put into a ball-milling machine, and then ball-milling mixed for 24 hours. The ball-milling product was dried and ground to form powder. An appropriate amount of the powder was pressed under a pressure of 40 kg/m$^2$ to manufacture a round body with a diameter of 11 mm, which was heated to 1500° C. to 1650° C. and kept for 1 hour to obtain a ceramic material. The ceramic material formed under this condition was too brittle to measure its hardness.

Comparative Example 5

$Al_2O_3$ (64 g, 100 wt %) and $ZrO_2$ (13.48 g, 21.1 wt %) were firstly mixed to form zirconia toughened alumina (ZTA). 100 parts by weight of ZTA and europium oxide (containing 1.76 parts by weight of Eu ions) were mixed, and the mixture powder and 80 g of ethanol were added into a ball-milling pot to be put into a ball-milling machine, and then ball-milling mixed for 24 hours. The ball-milling product was dried and ground to form powder. An appropriate amount of the powder was pressed under a pressure of 40 kg/m² to manufacture a round body with a diameter of 11 mm, which was heated to 1500° C. to 1650° C. and kept for 1 hour to obtain a ceramic material. The ceramic material had a hardness of 713.4 Hv10.

Comparative Example 6

$Al_2O_3$ (64 g, 100 wt %) and $ZrO_2$ (13.48 g, 21.1 wt %) were firstly mixed to form zirconia toughened alumina (ZTA). 100 parts by weight of ZTA and gadolinium oxide (containing 1.76 parts by weight of Gd ions) were mixed, and the mixture powder and 80 g of ethanol were added into a ball-milling pot to be put into a ball-milling machine, and then ball-milling mixed for 24 hours. The ball-milling product was dried and ground to form powder. An appropriate amount of the powder was pressed under a pressure of 40 kg/m² to manufacture a round body with a diameter of 11 mm, which was heated to 1500° C. to 1650° C. and kept for 1 hour to obtain a ceramic material. The ceramic material had a hardness of 730.8 Hv10.

Comparative Example 7

$Al_2O_3$ (64 g, 100 wt %) and $ZrO_2$ (13.48 g, 21.1 wt %) were firstly mixed to form zirconia toughened alumina (ZTA). 100 parts by weight of ZTA and terbium oxide (containing 1.77 parts by weight of Tb ions) were mixed, and the mixture powder and 80 g of ethanol were added into a ball-milling pot to be put into a ball-milling machine, and then ball-milling mixed for 24 hours. The ball-milling product was dried and ground to form powder. An appropriate amount of the powder was pressed under a pressure of 40 kg/m² to manufacture a round body with a diameter of 11 mm, which was heated to 1500° C. to 1650° C. and kept for 1 hour to obtain a ceramic material. The ceramic material had a hardness of 450.9 Hv10.

Comparative Example 8

$Al_2O_3$ (64 g, 100 wt %) and $ZrO_2$ (13.48 g, 21.1 wt %) were firstly mixed to form zirconia toughened alumina (ZTA). 100 parts by weight of ZTA and molybdenum oxide (containing 1.35 parts by weight of Mo ions) were mixed, and the mixture powder and 80 g of ethanol were added into a ball-milling pot to be put into a ball-milling machine, and then ball-milling mixed for 24 hours. The ball-milling product was dried and ground to form powder. An appropriate amount of the powder was pressed under a pressure of 40 kg/m² to manufacture a round body with a diameter of 11 mm, which was heated to 1500° C. to 1650° C. and kept for 1 hour to obtain a ceramic material. The ceramic material formed under this condition was too brittle to measure its hardness.

Comparative Example 9

$Al_2O_3$ (64 g, 100 wt %) and $ZrO_2$ (13.48 g, 21.1 wt %) were firstly mixed to form zirconia toughened alumina (ZTA). 100 parts by weight of ZTA and bismuth oxide (containing 1.83 parts by weight of Bi ions) were mixed, and the mixture powder and 80 g of ethanol were added into a ball-milling pot to be put into a ball-milling machine, and then ball-milling mixed for 24 hours. The ball-milling product was dried and ground to form powder. An appropriate amount of the powder was pressed under a pressure of 40 kg/m² to manufacture a round body with a diameter of 11 mm, which was heated to 1500° C. to 1650° C. and kept for 1 hour to obtain a ceramic material. The ceramic material had a hardness of 344.4 Hv10.

As known from the above Examples, ZTA could be doped with the appropriate amounts of zinc ions and the specific metal ions (e.g. Cr, Ti, Gd, Mn, Co, or Fe) to increase the hardness of ZTA. If the metal ions besides the above metal ions were selected, the hardness of the doped ZTA might not be efficiently improved or even dramatically lowered (e.g. Bi or Tb), or the doped ZTA would be too brittle to measure its hardness (e.g. V or Mo).

It will be apparent to those skilled in the art that various modifications and variations can be made to the disclosed methods and materials. It is intended that the specification and examples be considered as exemplary only, with the true scope of the disclosure being indicated by the following claims and their equivalents.

What is claimed is:

1. A ceramic material, consisting of:
   zirconia toughened alumina (ZTA), which is doped with zinc ions and other metal ions, wherein the other metal ions are chromium (Cr) ions, titanium (Ti) ions, gadolinium (Gd) ions, manganese (Mn) ions, cobalt (Co) ions, iron (Fe) ions, or a combination thereof,
   wherein the zinc ions and the other metal ions have a weight ratio of 1:0.05 to 1:1.25.

2. The ceramic material as claimed in claim 1, wherein the alumina and zirconia have a weight ratio of 100:15 to 100:30.

3. The ceramic material as claimed in claim 1, wherein the zirconia toughened alumina and the zinc ions have a weight ratio of 100:1 to 100:2.

4. The ceramic material as claimed in claim 1, wherein the zirconia toughened alumina and the other metal ions have a weight ratio of 100:0.5 to 100:2.

5. The ceramic material as claimed in claim 1, having a hardness of 1600 HO 0 to 2200 Hv10.

6. The ceramic material as claimed in claim 1, having a bending strength of 600 MPa to 645 MPa.

7. A wire bonding capillary, comprising:
   a ceramic material, consisting of:
   zirconia toughened alumina (ZTA), which is doped with zinc ions and other metal ions, wherein the other metal ions are chromium (Cr) ions, titanium (Ti) ions, gadolinium (Gd) ions, manganese (Mn) ions, cobalt (Co) ions, iron (Fe) ions, or a combination thereof,
   wherein the zinc ions and the other metal ions have a weight ratio of 1:0.06 to 1:0.9.

8. The wire bonding capillary as claimed in claim 7, wherein the alumina and zirconia have a weight ratio of 100:15 to 100:30.

9. The wire bonding capillary as claimed in claim 7, wherein the zirconia toughened alumina and the zinc ions have a weight ratio of 100:1 to 100:2.

10. The wire bonding capillary as claimed in claim 7, wherein the zirconia toughened alumina and the other metal ions have a weight ratio of 100:0.5 to 100:2.

11. The wire bonding capillary as claimed in claim 7, having a hardness of 1600 Hv10 to 2200 Hv10.

12. The wire bonding capillary as claimed in claim 7, having a bending strength of 600 MPa to 645 MPa.

\* \* \* \* \*